(12) United States Patent
Taylor

(10) Patent No.: US 6,584,591 B1
(45) Date of Patent: *Jun. 24, 2003

(54) TIMING CONTROL FOR INPUT/OUTPUT TESTABILITY

(75) Inventor: Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/565,827

(22) Filed: May 5, 2000

Related U.S. Application Data

(62) Division of application No. 08/998,487, filed on Dec. 24, 1997, now Pat. No. 6,085,345.

(51) Int. Cl.[7] .......................... G01R 31/28; G06F 11/00; H03M 13/00

(52) U.S. Cl. ......................................... 714/731; 714/815

(58) Field of Search ................................. 714/815, 814, 714/812, 811, 731, 745, 798; 713/500, 600, 400, 401; 375/357, 354; 702/79

(56) References Cited

U.S. PATENT DOCUMENTS

| 5,359,727 A | * | 10/1994 | Kurita et al. ............... 713/400 |
| 5,867,542 A | * | 2/1999 | Iwamatsu et al. ........... 375/354 |
| 6,028,898 A | * | 2/2000 | Sparks et al. ............... 375/317 |
| 6,085,345 A | * | 7/2000 | Taylor ........................ 714/731 |

* cited by examiner

Primary Examiner—Christine T. Tu
(74) Attorney, Agent, or Firm—Blakely, Sokoloff, Taylor & Zafman LLP

(57) ABSTRACT

Circuitry added to chips that use source synchronous techniques reduces difficulties associated with testing the chips. The circuitry increases the ability to use source synchronous techniques for data transmission. The circuitry is implemented in a delayed-lock loop (DLL) in either a transmitter (driver) or a receiver. The DLL measures the phase difference between a strobe signal and a delayed strobe signal. The DLL can be externally controlled by a source selectable input which allows the delay of the delayed strobe signal to be varied to test $T_{setup}$ and $T_{hold}$ in the receiver without varying the timings of the strobe signal and the data signals supplied to the chips. A timing measurement circuit having the strobe signal, the delayed strobe signal, and reference signals as inputs may be used to calibrate the phase difference between the strobe signal and delayed strobe signal.

8 Claims, 7 Drawing Sheets

TIMING CONTROL FOR INPUT/OUTPUT TESTABILITY

CROSS REFERENCE TO RELATED APPLICATIONS

This application is a divisional of application Ser. No. 08/998,487, filed Dec. 24, 1997 U.S. Pat. No. 6,085,345.

BACKGROUND OF THE INVENTION

1. Field of the Invention

The invention is related to source synchronous techniques, and in particular to the addition of delay circuitry to a chip that uses source synchronous techniques to improve testability of the chip.

2. Description of the Related Art

Strobe signals are clock signals that are transmitted with data signals, either simultaneously or after a predetermined delay. The strobe signal is used to time-synchronize data appearing as input signals at a receiver from a driver (transmitter). The use of the strobe signal to indicate when data should be sampled avoids using a clock which is sent to both driver and receiver. If this latter technique is used, then the skew between the two versions of the clock (transmitter and receiver) must be added to the time that each bit is driven from the driver, slowing it down. Sending the clock along with the data eliminates this skew by using the transmitter's clock both to send the data and to send the strobe. Data transfers are referred to as source synchronous when the clock (or strobe) signal that latches the data is supplied by the same chip (a driver) that is driving the data. With source synchronous data transfers, the same process, temperature, and voltage variations affect both the data and clock timings, and a multi-chip system does not need additional timing margin to account for independent variation in these variables along the clock and data paths.

Source synchronous I/O techniques permit very high bandwidth per chip pin. Usage of these techniques, however, is limited because of the difficulty in testing such circuits. Source synchronous circuits are difficult to test because: (1) they operate very fast, requiring great precision in tester edge (a high-to-low or low-to-high transition in a digital signal) placement accuracy; and (2) critical output timings are measured from one output pin to another, rather than from a clock input pin to an output pin.

The need for high precision edge placement leads to the use of very expensive testers. Testers are designed to place and measure edges with respect to a clock signal that the tester provides to the chip being tested. This restriction greatly simplifies the design of the tester, but also greatly complicates measuring the timing parameters that are critical to source synchronous outputs. For a centered clocking driver, these parameters include the time after the strobe which data is valid ($T_{va}$) and the time before the strobe which data is valid ($T_{vb}$) $T_{vb}$ is to be compared to the setup time $T_{setup}$ (required short time of stability before an active clock edge) and $T_{va}$ is to be compared to the hold time $T_{hold}$ (required short time of stability after the active clock edge) of the receiver. Large values are desirable for $T_{va}$ and $T_{vb}$, which are related to the minimum and maximum output delay.

Source synchronous data transfers may be effected with either a coincident clocking signal 10 or a centered clocking signal 12, as shown in FIG. 1. For both, it is desirable for a data signal 16 to be strobed in the centers 20 of their respective valid windows or cells 22. In other words, it is desirable to have the rising and falling edges of a strobe signal be time coincident with the centers 20. Both edges 14a and 14b of a strobe 14 are used to sample the data 16 in adjacent cells 20, as illustrated in FIG. 1. To do this with coincident clocking 10, the receiver delays the incoming strobe 14 by one-quarter of a clock (strobe) cycle to properly latch (sample) the data 16 being received. On the other hand, with centered clocking 12, the driver (not shown) needs to delay an outgoing strobe 18 by a quarter of a clock (strobe) cycle to sample with both edges 18a and 18b. In FIG. 1, the strobe 18 is shown already delayed by a quarter clock cycle. Coincident clocking 10 thus offers better driver power supply noise correlation between the strobe 14 and the data 16, while centered clocking 12 allows for a much simpler receiver.

Referring to FIG. 2a, a coincident clocking transmitter and receiver system 8, which may be located on a semiconductor device, is shown. A transmitter 33 is a simple circuit, and the inclusion of a delay-locked loop (DLL) 32 in a receiver 30 compensates for a distribution delay (for instance, with an RC recruit) to a flip-flop 34 or a plurality of such flip-flops (i.e., because an RC distribution network 38 is included in the DLL 32 in the receiver 30) at the same time that it generates a 90° phase shift of the incoming strobe signal 14, as will be discussed below. On the other hand, FIG. 2b shows a centered clocking transmitter and receiver system 9, which may also be located on a semiconductor device. In the system 9, a receiver 31 is a simple circuit, but, in contrast to the system 8, the RC distribution delay for propagating a strobe signal 40' (≅14') within the receiving chip 31 is not compensated because an RC distributed network 38' (like the one in the receiver 31) is not included in the DLL 32' in the transmitter 35.

The DLL 32 having the RC distribution network 38 in the receiver 30 and the DLL 32' not having the RC distribution network 38' in the transmitter 35 contribute, among other factors, to differences between analogous signals 50a and 50a', 50b and 50b', 14 and 14', and 40 and 40' within the respective DLL's 32 and 32', although both systems 8 and 9 will produce ideally substantially the same signal 40.

Referring again to FIG. 2a, the DLL 32 is coupled to a clock input port 37 of a latch 34, for example, a flip flop (FF), and controls latching of the data signal 16, which is input to the latch 34 through a data input port 39 of the latch 34. The solid dots above and below the latch 34 indicate that there may be more than one latch 34 coupled to the DLL 32 (and 32') to receive delayed strobe signals, as will be discussed below. (Similarly, solid dots above and below a latch 41 in the transmitter 33 (and 35) indicate that there may be more than one FF 41 coupled to the receiver 30 [and 31]).

Although most of the following discussion is framed in terms of the coincident clocking signal 10, it should be understood that the concepts involved apply equally well to driver circuits (e.g., the transmitter 35 in FIG. 2b) that are used to generate the centered clocking signal 12 for source synchronous data transfer. The DLL 32 receives as an input signal the strobe signal 14 and includes a delay line 36, the distributed RC network 38, another distributed RC network 44, a delay line 42, a phase detector (PD) 48, and a filter (e.g., an RC low pass filter) 52, as shown in FIG. 2a. The distributed RC network 44 is built to approximately match the distributed RC network 38. Likewise, the delay line 42 is built to approximately match the delay line 36. This is done to have the delay from signals 14 to 40 be approximately the same as the delay from signals 40 to 46. A disadvantage to the centered clocking approach is that the delay across the network 38' cannot be fully compensated by just including a network like the network 44 in the driver 35, because the RC distribution network 38' and the network like the network 44 would no longer be in the same chip, subject to the same process, voltage, and temperature variations. The DLL 32 is used to delay the strobe (or clock) 14 (i.e., the edges 14a and 14b) to provide a centered clock similar to the centered strobe signal 12 (see FIG. 1). The delay will enable the data 16 to be sampled (latched) by the latch 34 in the centers 20 of their respective valid windows 22. This ensures optimum (i.e., short) setup and hold times for the receiving latch 34.

In an alternative implementation (not shown) having no DLL, it is possible to use a falling clock edge to drive the strobe signal from a transmitter. This alternative centered clocking driver implementation is compatible with the receiver in the system 9. Elimination of the DLL entirely, however, reduces the controllability of timing for source synchronous techniques, and adds a dependency on clock duty cycle.

Referring to the operation of the DLL 32 (FIG. 2a) in more detail, the DLL 32 receives the strobe signal 14, delays it through the delay line 36, and then delivers (distributes) it to the data latch 34 through the distributed RC network 38. Distribution by the network 38 results in a delayed signal DlyStb 40, which is used to clock the data latch 34. The DlyStb signal 40 is fed back through the delay line 42 and the distributed RC network 44, which is similar to the distributed RC network 38 used in distributing the DlyStb signal 40. Although the networks 38 and 44 are discussed herein as distributed RC networks, it is understood that they could be any network that propagates a signal from an input to a plurality of outputs like latches 34 with a predictable delay, and may include active elements. The output signal of the delay line 42 is delivered (distributed) by the network 44 and results in a feedback strobe (FbStb) signal 46, which is input to the PD 48 for comparison to the original strobe 14, which is also input to the PD 48. If FbStb 46 arrives at the PD 48 before the next edge (e.g., the next edge 14a in FIG. 1) of the strobe signal 14, then the PD 48 outputs one value (e.g., low) of a voltage 50a, which is then filtered by the RC low pass filter 52 to a control voltage $V_{cntl}$ 50b. The $V_{cntl}$ 50b is then used to slow down (increase the delay in) the delay lines 36 and 42. On the other hand, if FbStb 46 arrives at the PD 48 after the next edge (e.g., the next edge 14a) of the strobe 14, then the PD 48 outputs another value (e.g., high) of the voltage 50a, which is filtered to a new value of the control voltage $V_{cntl}$ 50b. The new value of the $V_{cntl}$ 50b then reduces the delay of the delay lines 36 and 42.

By driving the delay lines 36 and 42 with $V_{cntl}$ 50b in such a way that the FbStb 46 and strobe 14 signals are aligned in time, the DlyStb signal 40 (i.e., its rising edge) will be positioned in time halfway between the edges (e.g., the edges 14a and 14b in FIG. 1) of the strobe signal 14 due to the matching circuitry (i.e., delay lines and RC distributed networks 36, 38 and 42, 44) used to generate the DlyStb 40 and the FbStb 46 signals. This ensures that the data latch 34 is sampled in the centers 20 of the data valid windows 22 (see FIG. 1), independent of process, temperature, and low frequency voltage changes. Under some circumstances, however, it may be desirable to start with the edges of the DlyStb 40 centered (nominally) and walk to an earlier time point relative to the centers 20 of the valid windows 22 by appropriate adjustment in the value of the $V_{cntl}$ 50b. Such circumstances, which move the DlyStb 40 signal around, may include: (1) for testing purposes, determining how far the DlyStb 40 edges can be moved, either toward the leading or falling edge of the window 22, before system breakdown or failure occurs; and (2) for debugging purposes, if setup time is longer than hold time, an adjustment could conceivably be made in which the DlyStb 40 edge is positioned toward the back edge of the window 22.

Although edge placement may be possible using the conventional techniques set forth above, these techniques may suffer from not offering enough controllability of the delay lines and complications associated with measuring timing parameters that are critical to source synchronous inputs. Therefore, a technique that provides additional delay line controllability and reduces difficulties associated with testing chips used in source synchronous data transfer would be useful.

SUMMARY OF THE INVENTION

In one aspect of the present invention, a source synchronous transfer circuit is provided. The source synchronous transfer circuit includes: (1) a delay circuit to receive a strobe signal and deliver a delayed strobe signal, wherein the magnitude of the delay is responsive to a control signal driven by selectable circuitry; and (2) a latch coupled to the delay circuit to receive the delayed strobe signal and sample a transfer signal in response to the delayed strobe signal.

In another aspect of the present invention, a method is provided for measuring timing margin available to a driver and receiver system forming a source synchronous interface. The method includes: (1) measuring a duty cycle as an indication of a phase difference between a signal and a delayed signal; (2) varying a control of the relative phase delay between the signal and the delayed signal; (3) testing the system to determine pass/fail phase delay limits of the source synchronous interface; (4) determining if the control of the relative phase delay is to be further varied, and if so, returning to (2); and (5) independently measuring the timing margin available to the system using the pass/fail limit.

BRIEF DESCRIPTION OF THE DRAWINGS

Other objects and advantages of the invention will become apparent upon reading the following detailed description and upon reference to the drawings in which.

Figure 1:
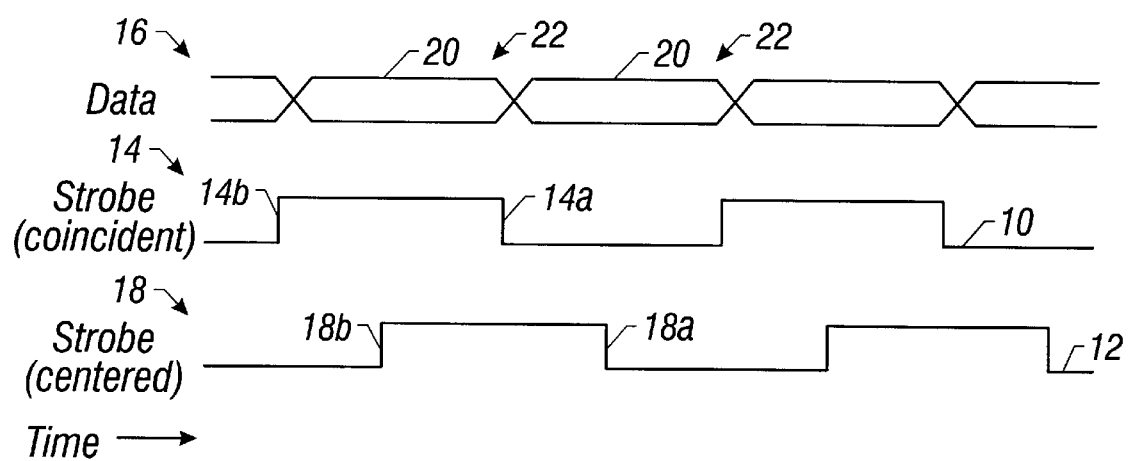
FIG. 1 is a timing representation of coincident and centered clocking for source synchronous data transfer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as they might be employed in a chip or multi-chip system using source synchronous techniques. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2A:
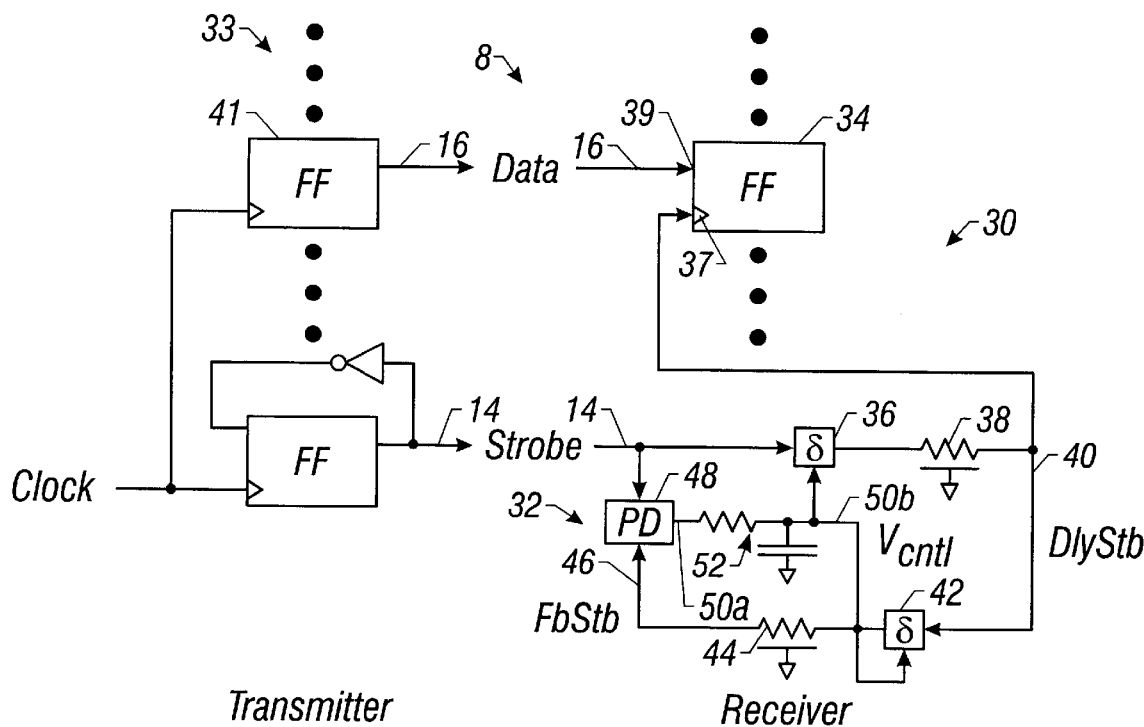
FIG. 2a is a representation of a typical coincident clocking transmitter/receiver (DLL) system.
Figure 2B:
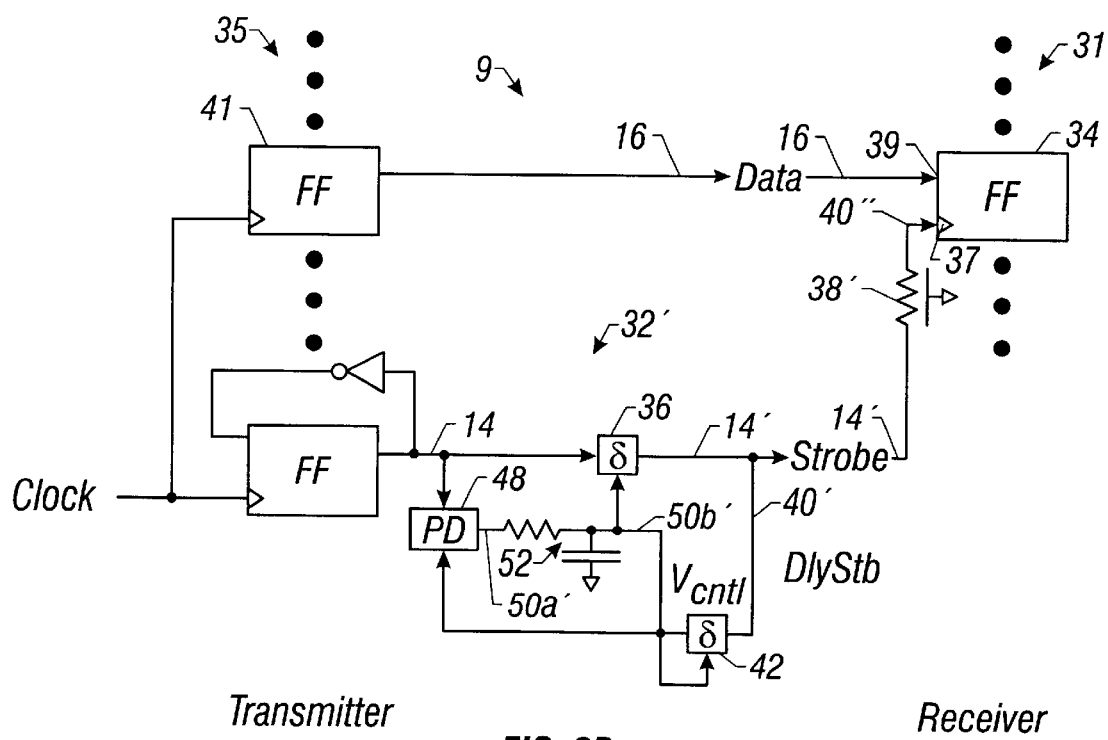
FIG. 2b is a representation of a typical centered clocking transmitter (DLL)/receiver system.
Figure 3:
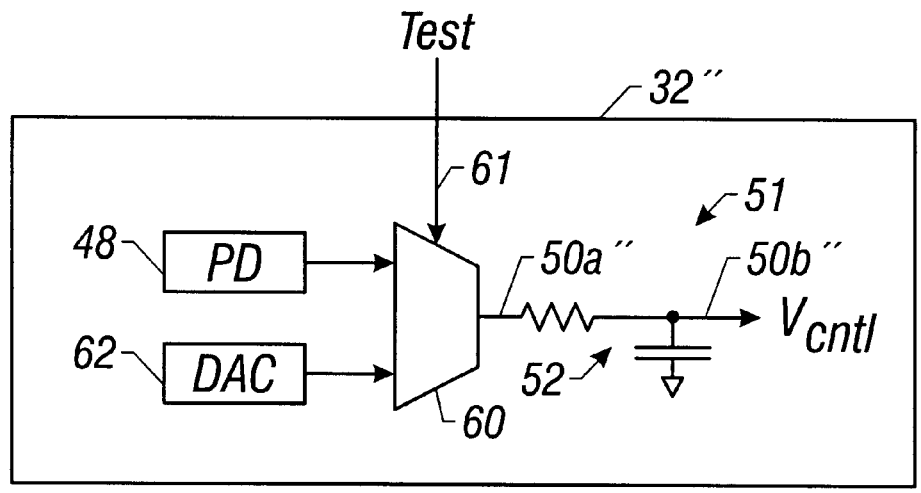
FIG. 3 is a representation of a circuit for modifying a control voltage for delay lines in a DLL in accordance with an embodiment of the invention.

Referring to the drawings, and specifically to FIG. 3, in accordance with an embodiment of the invention, a portion 51 of a DLL 32", which is a modification of the DLL 32 in FIG. 2a (or DLL 32' in FIG. 2b), is illustrated. The modified portion 51 generates a control voltage $V_{cntl}$ 50b" for the delay lines 36 and 42 that permits additional controllability of the delay lines 36 and 42. Not all details of the DLL 32" are shown in FIG. 3, and only the portion 51 of the DLL 32" is shown for simplification of the drawings. It is to be understood, however, that the other elements of the DLL 32 (or DLL 32') shown in FIG. 2a (or FIG. 2b) are also included in the DLL 32". In the DLL 32", a pass gate multiplexer 60, whose output is a signal 50a", is added between the PD 48 and the RC low pass filter 52. The signal 50a" is converted to the control voltage $V_{cntl}$ 50b" (which will be, in general, different for the DLL 32' and the DLL 32 because of the differences discussed above related to their respective lack of and inclusion of the RC distribution networks). The multiplexer 60 allows $V_{cntl}$ 50b" to be alternatively driven from a digital-to-analog converter (DAC) 62. The delay of the DLL 32" may be controlled accordingly by the PD 48 in normal operation, or externally controlled (e.g., by a logic tester [not shown]) during testing, when so enabled by a "test" signal 61 to the multiplexer 60. The PD 48 drives the RC low pass filter 52 if test signal 61 is not enabled, and ideally provides a 90 degree phase shift between the strobe 14 and the DlyStb 40 or 40" signals (see FIGS. 2a–b) for coincident clocking or centered clocking. (The signal 40" is not, in general, the same as the DlyStb 40 signal because the DLL 32" [FIG. 3], whose operation results in a signal 40' [≅14'], lacks the RC distribution network 38'.) External control with the logic tester allows the time to be varied at which the delayed strobe signal, DlyStb 40 or 40" (i.e., the signal after the RC distribution network 38'), reaches the data latch 34. The DAC 62 provides an input value to the filter 52 that adjusts the delay of the DlyStb 40 (or 40") signal by modifying $V_{cntl}$ 50b".

By delivering the DlyStb 40 (or 40") to the data latch 34 either earlier or later than its normal time, the setup time $T_{setup}$ and hold time $T_{hold}$ of the data latch 34 can be tested without varying the timings of the data 16 and the strobe 14 signals supplied to the latch 34 and the DLL 32 (or the DLL 32"). The DAC 62 and test signal 61 applied to the multiplexer 60 (with the portion 51 modification made to DLL's 32 or 32') may be controlled through a standard connector (e.g., a JTAG [Joint Testing Action Group] 5 pin connector according to the IEEE Standard 1149.1 [IEEE Std. 1149.1-1990, published 1990, "IEEE Standard Test Access Port and Boundary-Scan Architecture."]), which provides for control of serial port access to registers (not shown) in the receiver 30 in FIG. 2a (or transmitter 35 in FIG. 2b). One of these registers controls the DAC 62, and the JTAG connector is used to load the register value for its control. Control through the JTAG may prevent the DAC 62 and test signal 61 from imposing any additional pin requirements on the receiver 30 (or the driver 35) being tested. This capability would be available for use in testing a multi-chip system, and not just for individual component testing.

Up to now, the discussion has concerned phase monitoring and adjusting. Measurement of phase and independent calibration of the measurement for determining the accuracy of the monitoring is also important. To address phase measurement calibration, reference is made to FIG. 4, which shows a circuit 70, in accordance with another embodiment of the invention. The circuit 70 may be used to measure the timing of the strobe 14 and the DlyStb 40 signals in system 8 in FIG. 2a (or signal 40" in system 9 in FIG. 2b). The circuit 70 includes pass gate multiplexers 76 and 78, an XOR gate 74, an RC low pass filter 82, and an analog-to-digital (ADC) converter 72. The circuit 70 may be added to a DLL (e.g., to the DLL's 32 or 32') to measure the phase relationship between the Strobe 14 and the delayed version of the strobe (i.e., DlyStb 40 or 40") that is used to sample or capture the data 16 by the data latch 34. The circuit 70 allows the timing placement of the DlyStb 40 (or 40") edges (e.g., edges 40a and 40b or 40a" and 40b" in FIGS. 5a–b) that are controlled by the DAC 62 (FIG. 3) or the PD 48 to be measured. The ADC 72 may be built using a comparator (not shown) and the same DAC 62 that is used in the DLL 32" in FIG. 3.

Figure 4:
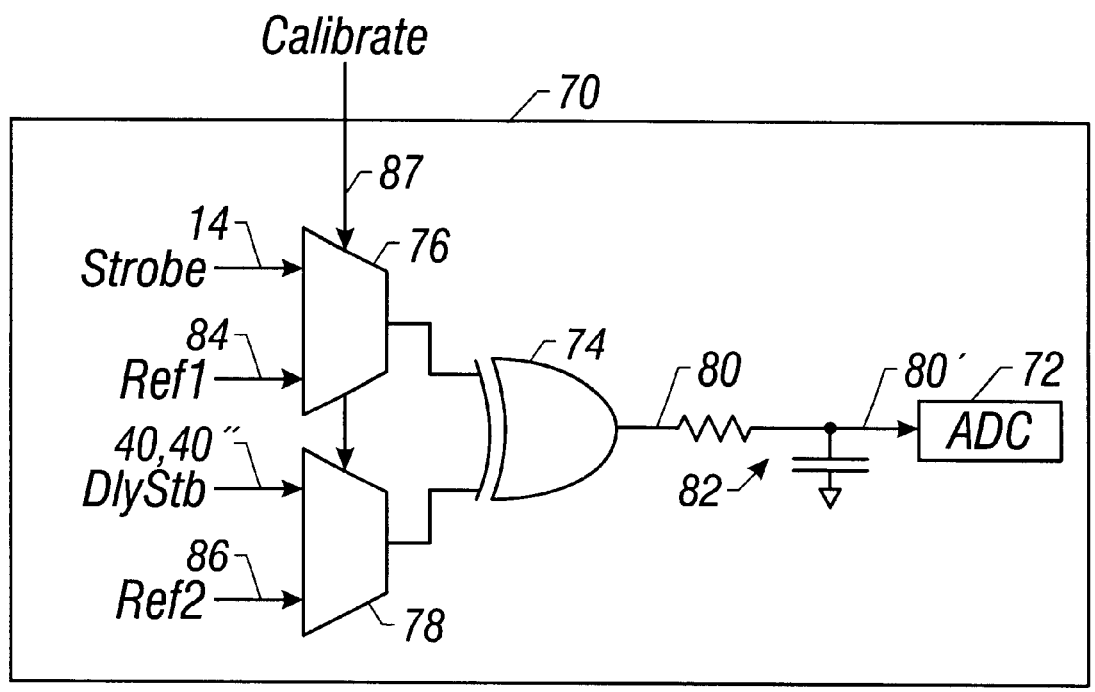
FIG. 4 is a representation of a timing measurement circuit in accordance with an embodiment of the invention.
Figure 5A:
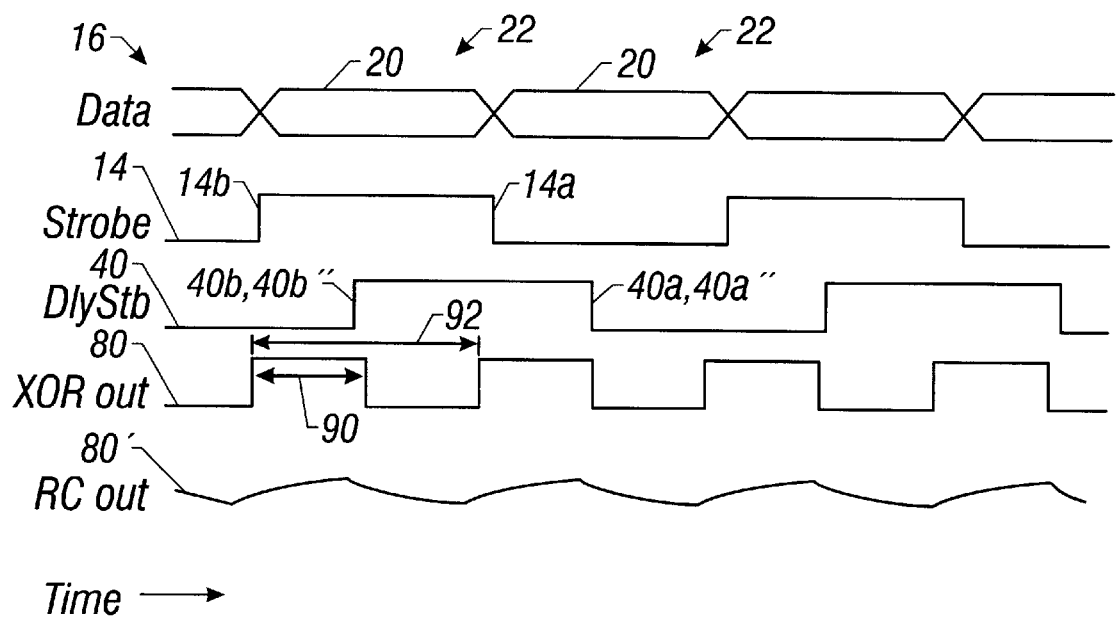
FIG. 5a is a timing representation for a nominal delay measurement in accordance with an embodiment of the invention.
Figure 5B:
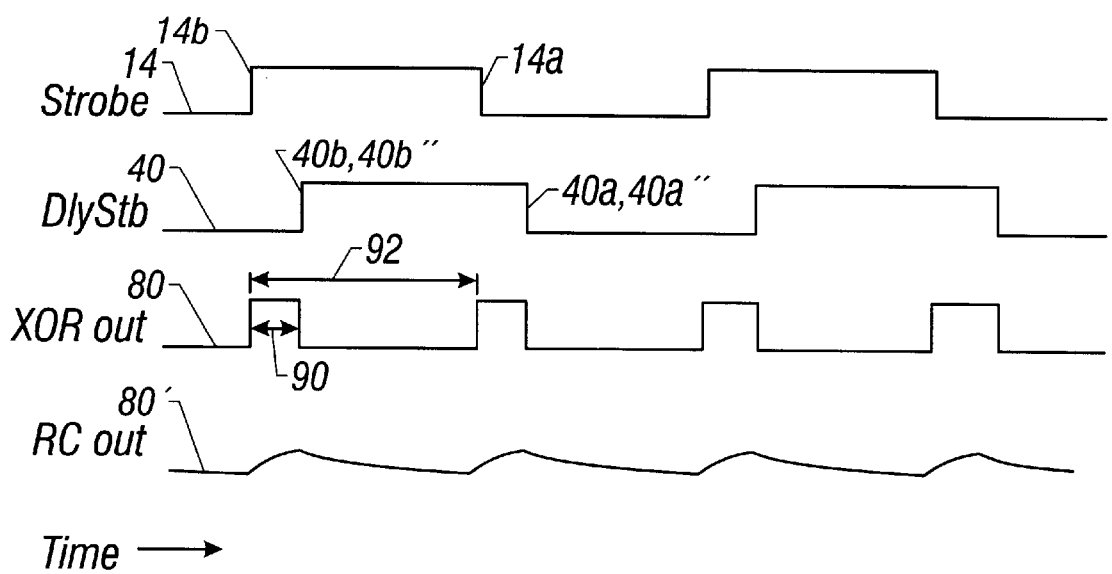
FIG. 5b is a timing representation for a skewed early delay measurement in accordance with an embodiment of the invention.

Referring to FIG. 4, in operation, the circuit 70 receives the strobe 14 and the DlyStb 40 (or 40") signals as inputs to the pass gate multiplexers 76 and 78, respectively. The circuit 70 allows the delay between the strobe 14 and the DlyStb 40 (or 40") signals to be measured by exclusive-ORing (XORing) the strobe 14 and the DlyStb 40 (or 40') signals using the XOR gate 74. An output signal 80 of the XOR gate 74 will be logically low when both the strobe 14 and DlyStb 40 (or 40") are in the same logic state, and will be logic high when the signals 14 and 40 (or 40") are in different logic states. The XOR output 80 will make a state transition only if one or the other of the strobe 14 and 40 (or 40") signals makes a transition. The delay between the signals 14 and 40 (or 40") may, therefore, be characterized by determining the duty cycle of the XOR output signal 80. Further details are shown in FIGS. 5a–b, where the duty cycle of the XOR output signal 80 is proportional to the delay between the strobe 14 and DlyStb 40 (or 40"). For the present invention, the duty cycle is defined as a pulse time length 90 of the XOR output signal 80 divided by a time length 92 of a cycle period of the XOR output signal 80. Although FIGS. 5a–b show only two possible (and different) duty cycles, the duty cycle could range from approximately 0%, when the DlyStb 40 (or 40") signal has approximately the same phase (timing) as the strobe 14 signal, to approximately 100% when the DlyStb 40 (or 40") is approximately 180 degrees out of phase with respect to the strobe 14. By filtering the output signal 80 of the XOR gate 74 with the RC low pass filter 82, the duty cycle may be converted to voltage, (i.e., to an analog voltage level). This voltage may be measured by the ADC 72, as described below.

FIG. 5a shows nominal timings for the strobe 14 and DlyStb 40 (or 40") signals, which are 90 degrees out of phase. In this case, the rising and falling edges 40a and 40b (or 40a" and 40b") of the DlyStb 40 (or 40") signal may be used to sample the data cells 22 at their centers 20. The output signal 80 of the XOR gate 74 therefore has an approximately 50% duty cycle because the time length 90 is approximately one-half the time length 92. The output signal 80 is filtered to a voltage 80' value of approximately VCC/2 by the RC low pass filter 82, where VCC is the output of the RC low pass filter 82 for 100% duty cycle (i.e., for the strobe 14 and the DlyStb 40 [or 40"] signals being 180 degrees out of phase). If the phase relationship between the strobe 14 and the DlyStb 40 (or 40") signals changes to approximately 45 degrees out of phase, as shown in FIG. 5b, however, the duty cycle of the XOR output signal 80 of the XOR gate 74 changes to approximately 25%. This changes the filtered output voltage 80' to a value of approximately VCC/4. The ADC 72 may measure (i.e., convert to a digital value) the voltage output 80' signal and the value measured is read out of the receiver 30 (or transmitter 35) through the JTAG connector. Because the frequency of the strobe 14 signal is a known quantity, the phase difference between the strobe 14 and the DlyStb 40 (or 40") signals, which corresponds to the signals 80, may easily be converted to a time delay.

Turning to calibration of phase measurement with the circuit 70, reference is made to FIG. 4. The pass gate multiplexers 76, 78 shown in FIG. 4 may also allow the XOR gate 74 to receive as inputs a pair of reference signals, Ref1 84 and Ref2 86, when a "calibrate" signal 87 to the multiplexers 76 and 78 is enabled. The reference signals 84 and 86 may be generated with a specific phase relationship from a core clock (not shown) in the receiver 30 (or transmitter 35). The output of the XOR gate 74 may be measured for this specific phase relationship, thereby providing a calibration of the relative phase measurements of the strobe 14 and the DlyStb 40 (or 40") signals.

Under certain circumstances, to help specify an accurate phase relationship between the reference signals 84 and 86 (e.g., 45°, 90°, 135°, etc.), the reference signals 84 and 86 may be of lower frequency than the strobe 14 or the DlyStb 40 (or 40") signals. When the output of the RC low pass filter 82 is driven by the lower frequency reference signals 84 and 86, the output may exhibit more ripple (see, e.g., signal "RC out" 80' in FIGS. 5a–b) compared to when it is driven by the strobe 14 and DlyStb 40 (or 40") signals. This is because the magnitude of the ripple is a function of frequency. Moreover, the center of the (rippled) output 80' of the RC filter 82 is a function of the duty cycle and the center value also affects the accuracy of the phase calibration. Although ripple effects can be reduced or minimized by the use of large values of resistance and capacitance in the RC low pass filter 82, sufficiently large values may require large areas of the receiver 30 (or the transmitter 35), depending upon the frequency of the reference signals 84 and 86.

Figure 6:
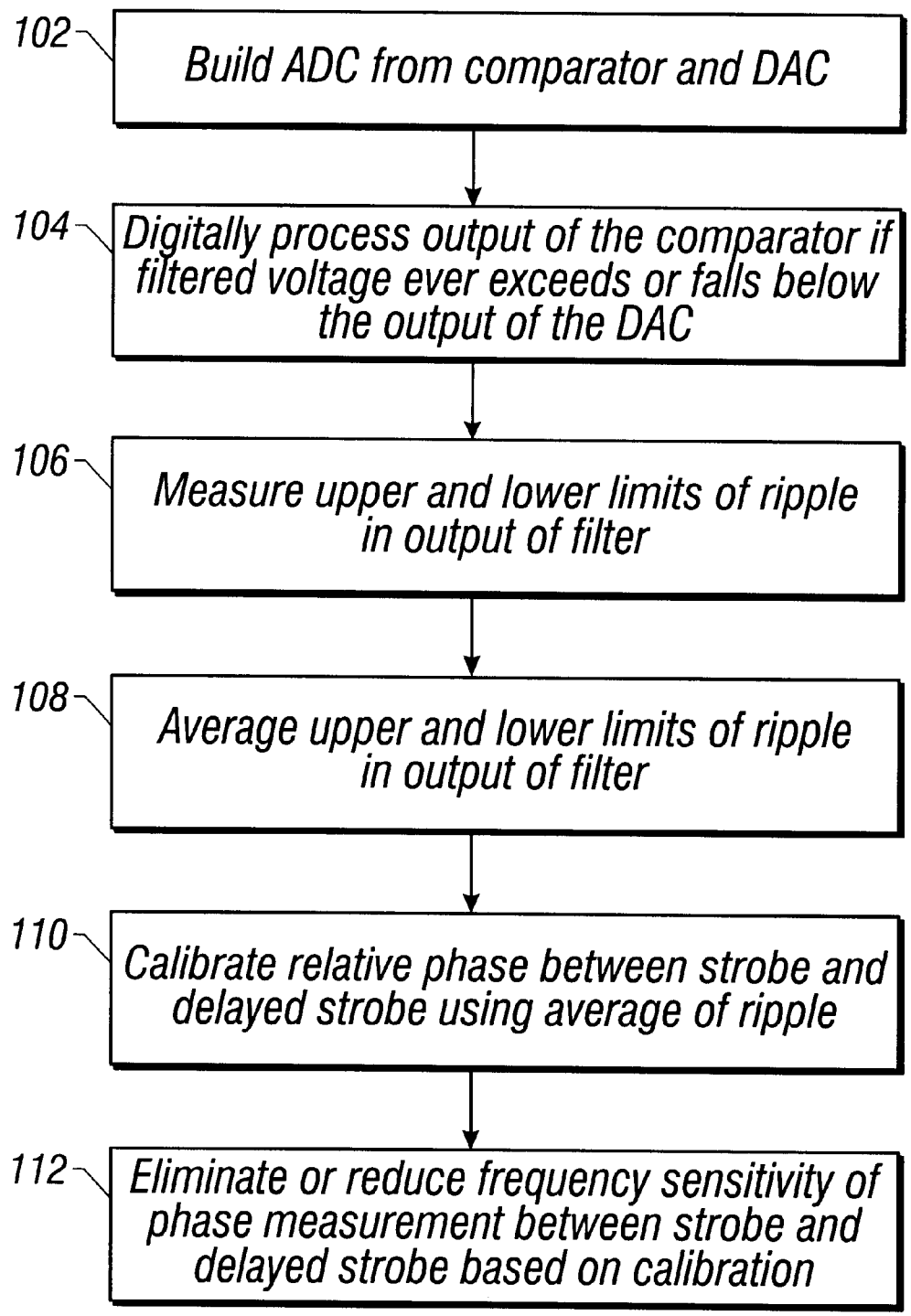
FIG. 6 is a flow chart of a method in accordance with an embodiment of the invention.
Figure 7:
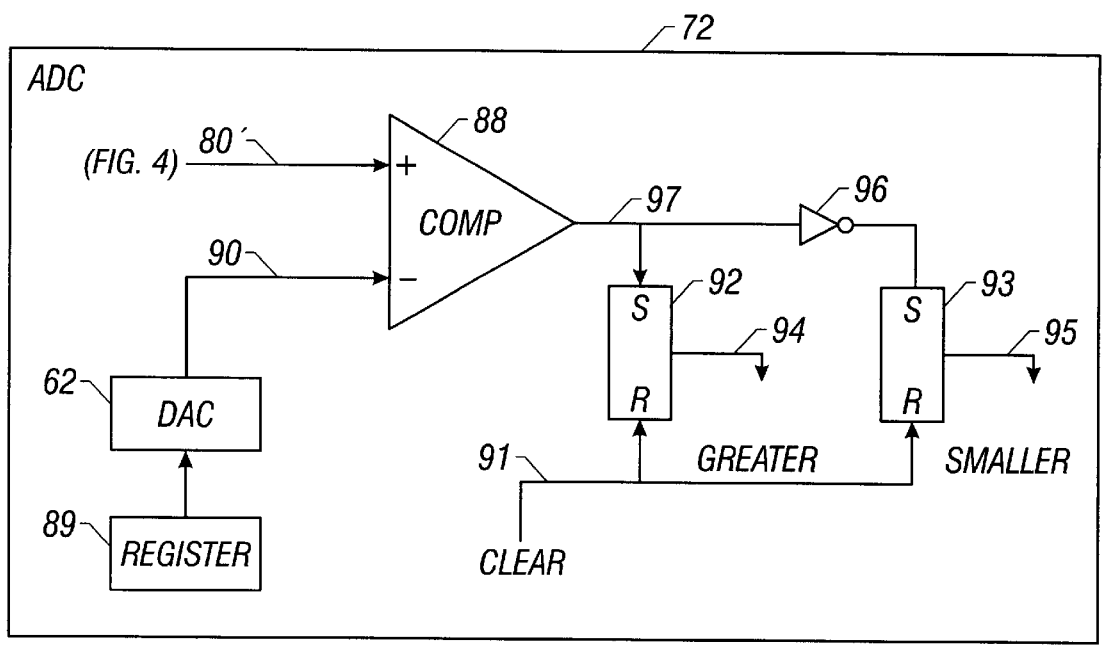
FIG. 7 is a representation of a device in accordance with an embodiment of the invention.

To address these effects, a method is shown in FIG. 6, in accordance with another embodiment of the invention, in which the accuracy of the timing (phase) measurements between the strobe 14 and the DlyStb 40 (or 40") signals may be enhanced. According to this method, at block 102, the ripple effects may be addressed by building the ADC 72 from, for example, a comparator 88 (see FIG. 7) and a DAC (e.g., the DAC 62). As shown in FIG. 7, a register 89 may be used to control a voltage output 90 by the DAC 62, a clear signal 91 may be used to reset R/S latches 92 and 93 that generate a greater signal 94 and a smaller signal 95 (the S input of the R/S latch 93 is inverted by an inverter 96) depending on whether the filtered voltage 80' ever exceeds or falls below the output 90 of the DAC 62, respectively. To test against a particular threshold voltage for the comparator, the following may be performed: (1) load the register 89 with a bit pattern that will generate the desired voltage. (The register 89 could be a counter to simplify testing a range of voltages.); (2) pulse the signal clear 91 to clear the R/S latches 92 and 93, generating the greater signal 94 and the smaller signal 95; (3) run a test; (4) the greater signal 94 will be a one if the filtered voltage 80' is greater than the DAC 62 output voltage 90 at any point during the test, and the smaller signal 95 will be a one if the filtered voltage 80' is less than the DAC 62 output voltage 90 at any point during the test (Note that both the greater signal 94 and the smaller signal 95 may be set if the voltage output 90 by the DAC 62 is within the range of the ripple on the signal 80'.); and (5) if there are additional voltages to be tested, go to (1). Thus, at block 104, the output 97 of the comparator 88 may be digitally processed (e.g., with the system in FIG. 7) if the filtered voltage 80' ever exceeds or falls below the output of the DAC 62. In this way, at block 106, the upper and lower limits of the ripple of the RC filter 82 may be separately measured and, at block 108, averaged, and, at block 110, the average used to calibrate (e.g., with the software) more accurately the relative phase between the strobe 14 and the DlyStb 40 (or 40") signals. At block 112, this may eliminate or reduce the frequency sensitivity of the phase measurement. For example, the output 90 of the comparator 88 may be processed with software to change the $V_{cntl}$ 50b" to ideally provide a 90 degree phase shift between the strobe 14 and the DlyStb 40 (or 40") signals.

Figure 8:
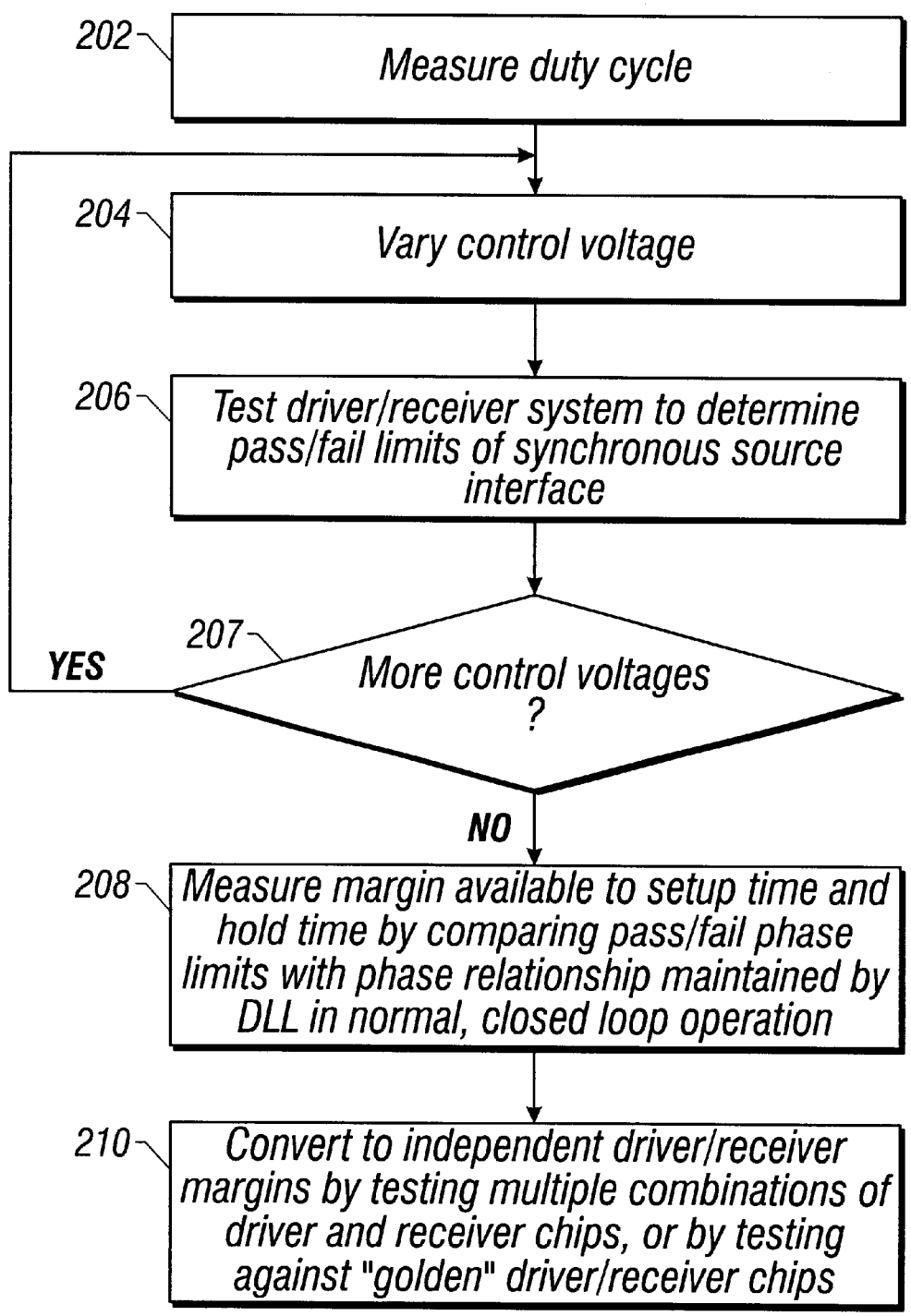
FIG. 8 is a flow chart of another method in accordance with an embodiment of the invention.

Timing margins for setup time $T_{setup}$ and hold time $T_{hold}$ (of the receivers 30 [or 31]) may also be investigated using the timing measurement circuit 70 and the DLL 32" when included in either a coincident clocked receiver chip (e.g., the receiver 30) or a centered clock driver (e.g., the driver 35), in accordance with embodiments of the invention. The timing margin that is available to a driver plus chip system (e.g., systems 8 or 9 in FIGS. 2a and 2b, respectively) may be measured. For example, referring to FIG. 8, a method in accordance with an embodiment of the invention is shown. According to this method, at block 202, the ADC 72 (FIG. 4) measures the duty cycle supplied by the phase detector 48 (FIG. 3), and, at block 204, $V_{cntl}$ 50b" is varied with the DAC 62 while the system is tested at block 206 (either by a tester or a BIST [built-in self test]) to determine the pass/fail (phase or time difference) limits of the source synchronous interface (i.e., in the systems 8 or 9). At block 207, it is determined if the $V_{cntl}$ 50b" is to be varied again. If so, the process returns to block 204 until $V_{cntl}$ 50b" is not to be varied anymore because the phase/fail limits (boundaries) have been found. In this way, many different control voltages 50b" can be tested and a user could examine the results and decide if further testing is necessary according to the method. For example, a linear search or a binary search may be performed. Alternatively, the control voltage 50b" variation could be fully computer controlled. Assuming that voltage and temperature are not varied during this process, then, at block 208, the margin available to $T_{setup}$ and $T_{hold}$ of the latch 34 may be independently measured by comparing the pass/fail phase limits with the phase relationship maintained by the DLL 32" in normal, closed loop operation. This margin measurement does not separate variation in the driver (e.g., drivers 33, 35) from variation in the receiver (e.g., receivers 30, 31) directly, but, at block 210, it can be converted to independent driver/receiver chip (e.g., driver 33/receiver 30 or drive 35/receiver 31) margins by testing multiple combinations of drivers and chips, or by testing against "golden" driver/test chips (i.e., against good or standard reference sets of the systems 8 or 9).

Not converting to independent driver/test chip margins, however, may be adequate. This is because operation of a driver/test chip system (e.g., systems 8 and 9) may not depend individually upon the values of $T_{va}$, $T_{vb}$, $T_{setup}$, or $T_{hold}$. Instead, the operation of the driver/receiver system may depend only on the sums $T_{vb}+T_{setup}$ and $T_{va}+T_{hold}$. Thus, although any of the individual values of $T_{va}$, $T_{vb}$, $T_{setup}$ or $T_{hold}$ may be out of specification, these combinations (sums) may still be within specification. Hence, not measuring the independent terms may not be significant in some embodiments.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method comprising:
    performing the following in a source synchronous interface
        producing a binary output signal whose duty cycle varies according to a phase difference between a signal and a delayed signal;
        filtering the binary output signal to produce a filtered signal; and
        converting the filtered signal to produce a digital indicator of a value of the duty cycle, the digital indicator being a digital number representing the phase difference.

2. The method of claim 1, further comprising:
    varying a control of the phase difference between the signal and the delayed signal;
    testing, responsive to said varying, to determine pass/fail phase delay limits of the source synchronous interface; and
    independently measuring a timing margin using the pass/fail limits.

3. The method of claim 2, wherein the source synchronous interface comprises a delay-locked loop, and wherein the independently measuring comprises independently measuring by comparing the pass/fail limits with a phase relationship maintained by the delay-locked loop in normal, closed loop operation.

4. The method of claim 2, wherein the independently measuring comprises independently measuring the timing margin available to setup time and hold time associated with a receiver using the pass/fail limits.

5. The method of claim 2, wherein the source synchronous interface comprises a delay-locked loop having a phase detector, and wherein the independently measuring comprises measuring a duty cycle supplied by the phase detector as an indication of the phase difference between the signal and the delayed signal.

6. The method of claim 5, further comprising converting the timing margin measurement to independent driver and receiver margins.

7. The method of claim 6, wherein the converting comprises converting the timing margin measurement to independent driver and receiver margins by testing multiple combinations of drivers and receivers.

8. The method of claim 6, wherein the converting comprises converting the timing margin measurement to independent driver and receiver margins by testing against standard drivers and receivers.

* * * * *